(12) United States Patent
Grunwald

(10) Patent No.: US 6,599,563 B2
(45) Date of Patent: Jul. 29, 2003

(54) METHOD AND APPARATUS FOR IMPROVING INTERFACIAL CHEMICAL REACTIONS IN ELECTROLESS DEPOSITIONS OF METALS

(75) Inventor: John Grunwald, Ramat-Gan (IL)

(73) Assignee: J.G. Systems Inc., Miami, FL (US)

( * ) Notice: Subject to any disclaimer, the term of this patent is extended or adjusted under 35 U.S.C. 154(b) by 0 days.

(21) Appl. No.: 10/230,269

(22) Filed: Aug. 29, 2002

(65) Prior Publication Data

US 2002/0197405 A1 Dec. 26, 2002

Related U.S. Application Data

(62) Division of application No. 09/822,502, filed on Apr. 2, 2001, now abandoned.

(30) Foreign Application Priority Data

Jan. 2, 2001 (IL) ................................................ 140680
Jan. 30, 2001 (IL) .................................................. 14179

(51) Int. Cl.[7] .............................. B05D 1/18; B05D 3/10; B05D 3/02; B05D 5/12
(52) U.S. Cl. ........................... 427/98; 427/97; 427/304; 427/305; 427/306; 427/314; 427/316; 427/318; 427/319; 427/437; 427/438; 427/443.1
(58) Field of Search ........................... 427/97, 98, 304, 427/305, 306, 314, 316, 318, 319, 430.1, 437, 438, 443.1

(56) References Cited

U.S. PATENT DOCUMENTS 3,882,695 A * 5/1975 Flicker ......................... 66/115
4,374,876 A * 2/1983 El-Shazly et al. ........ 427/443.1
4,917,958 A * 4/1990 Akai et al. ................... 428/457
5,648,125 A * 7/1997 Cane ........................... 427/534

FOREIGN PATENT DOCUMENTS

FR     2046679 A  *  3/1971

* cited by examiner

*Primary Examiner*—Michael Barr
(74) *Attorney, Agent, or Firm*—Edward Langer, Pat. Atty.; Shiboleth, Yisraeli, Roberts, Zisman & Co.

(57) ABSTRACT

A method and apparatus for improving interfacial chemical reactions in electroless depositions of metals, in which the substrate to be plated is pre-heated prior to its immersion in the various processing solutions that require elevated temperatures, and especially before immersion in the electroless plating solution. The pre-heating is carried out to a temperature that is needed to bring about the desired chemical reaction at the substrate-solution interface, allowing the bath of that process step to operate significantly below the temperature that would have been needed if the panel had not been pre-heated, and below the solution temperature of current practice. According to another aspect of the present invention, the electroless plating apparatus for plating a workpiece operates in a vertical mode and it comprises a heating station, with the panel to be plated returning to the heating station as dictated by the temperature required for a given process step. Alternatively, the heating station is incorporated into the hoist system of such apparatus. In still another aspect of the present invention, the electroless plating apparatus operates in a horizontal mode and comprises at least one heating station.

12 Claims, No Drawings

METHOD AND APPARATUS FOR IMPROVING INTERFACIAL CHEMICAL REACTIONS IN ELECTROLESS DEPOSITIONS OF METALS

Divisional of prior application Ser. No. 09/822,502, filed Apr. 2, 2001, now abandoned.

FIELD OF THE INVENTION

The invention describes a method and apparatus for improving interfacial chemical reactions in electroless depositions of metals, and more particularly for producing a through-hole-plated Printed Circuit Board (PCB).

BACKGROUND OF THE INVENTION

U.S. Pat. Nos. 4,279,948, 4,265,943, and 4,209,331, which are hereby referenced in their entirety, summarize the prior art of using electroless copper to prepare non-conductive through-hole walls for electrolytic copper plating, said through-hole walls predominantly consisting of electrically insulating glass-epoxy composites.

In this application the terms process tanks, process solutions, process steps and process stations are interchangeable. The term "substrate" is meant to denote workpiece, panel, board, PCB, with or without through-holes, these terms being interchangeable.

Indeed, the substrate, with its through holes, has to undergo a long, intricate sequence of process steps before the hole walls are electrically conductive and electroplatable. Many of these process steps require bath temperatures weal above ambient for the desired chemical reactions to take place. In current practice, the through-hole panels enter the process solutions mostly following cold water rinses, resulting in significant heat transfer time delays before the panel/solution interface reaches the "threshold" temperature, below which, the desired reaction will not take place satisfactorily.

U.S. Pat. Nos. 3,532,518 and 3,011,920 are referenced herewith to show the crucial importance of adequate catalytic preparation of the polymer hole walls for electroless copper to take place on non-conductive substrates.

Perhaps the most critical step in the PCB production process, is the electroless copper bath, known also as chemical copper. In order to achieve complete, void-free coverage of the through-hole walls, the electroless copper bath must operate at a sufficiently elevated temperature to provide the necessary "activation energy" for the reduction of cupric and/or cuprous ions in solution to metallic copper. Indeed, electroless copper deposition, whether obtained via formaldehyde, or via the environmentally friendlier hypophosphite as the main reducer, is understood to be the result of a complex sequence of intermediate reactions that take place at the interface of the Pd-catalyzed non-conducting polymer hole walls and the electroless Cu solution. Excessively low interfacial temperatures will retard copper initiation to a point where coverage will be incomplete, resulting in rejects.

More importantly, significant delays in chemical copper initiation are especially harmful in hypophosphite-reduced baths, because unlike formaldehyde baths, they are not autocatalytic, and Cu deposition is understood to essentially cease after the Pc layer over the hole wall surface is coated with a continuous coating of Cu. Contamination, or poisoning, of the Pd catalytic layer on the hole wall occasioned by slow initiation of copper deposition due to low interfacial temperature in the electroless copper bath may cause deposition of poorly conductive copper oxides, areas with no deposit at all, or a combination of both. Also, while formaldehyde type electroless copper baths operate at temperatures in the range of 25° C., the recommended operating temperature of hypophosphite-based electroless copper systems is 70° C., perceived by both equipment manufacturers and PCB producers as restrictive and not user-friendly.

A technical document entitled "Process Operating Guide, M system" by MacDermid Inc., is referenced herewith, as indicative of the elaborate process steps required for satisfactory PCB production, with some process steps using solutions that require elevated temperatures. With some few exceptions, PCB production facilities currently use automatic plating machines, wherein a computer-programmed hoist carries panels to be plated through the various process steps, with the panels mounted on vertical jigs, also called racks. The software that directs the movement of the hoist is called timeway. The jigs, with the mounted panels, enter and exit the process solutions in a vertical position.

Relatively recently, some PCB producers have changed to horizontal, conveyorized equipment, wherein PCB panels move through the process solutions in a horizontal, as opposed to vertical mode. Horizontal machines are gaining attention, principally because of reduction in labor expenses one such horizontal PCB machine is called Uniplate LB and can be obtained from Atotech.

SUMMARY OF THE INVENTION

A central consideration behind the present invention hinges on the fact that one deals mainly with interfacial chemical reactions, as opposed to predominantly bulk reactions, when practicing Pd activation and electroless depositions on a substrate. The prior art use of large bath volumes is in most cases superfluous, such that the reduction in bath volume in the present invention results in considerable savings due to reduction in waste disposal volumes and inherent environmental problems.

Thus, the present invention provides according to a first of its aspects, an improved method for manufacturing a PCB, wherein the board to be plated is pre-heated prior to its immersion in an electroless plating solution. The pre-heating is carried out at a temperature that is needed to bring about the desired chemical reaction at the panel-solution interface, allowing the bath of that process step to operate significantly below the temperature that would have been needed if the panel had not been pre-heated, and below the solution temperature of current practice.

According to another aspect of the present invention, the electroless plating apparatus for plating a workpiece, operates in a vertical mode and it comprises a heating station, with the panel to be plated returning to the heating station as dictated by the temperature required for a given process step. Alternatively, the heating station is incorporated into the hoist system of such apparatus.

In still another aspect of the present invention, the electroless plating apparatus operates in a horizontal mode and comprises at least one heating station. The station element where the preheating is to take place is stationary and the panel to be plated can only move in a forward direction, as dictated by conveyorized, moving belt type equipment. Preheating therefore needs to be limited to the most critical process steps such as for example activation or electroless plating.

In a preferred embodiment, a workpiece to be plated is preheated in an appropriate hot chemical solution, thus entering the subsequent process tank without the usual water rinses, as accepted in the industry. By enveloping the workpiece in a desirable, compatible hot liquid layer that will preferably participate in the reaction, one can greatly enhance the desired effect of a given process. This embodiment is referred to hereinbelow as Participant Liquid Layer (PLL) technology.

Thus, the method of the present invention provides an economical approach for interfacial chemical reactions, enabling a reduction in bath volume, and therefore a reduction in waste disposal volumes, which is environmentally desirable. The method can be used with both horizontal and vertical type plating apparatuses, so that it is easily and conveniently adaptable to current manufacturing practices. Use of the PLL technology, as stated, enhances the results of the process.

Additional features and advantages of the present invention will become apparent from the following description.

DETAILED DESCRIPTION OF THE INVENTION

The preheating of the through-hole panel to be plated can be accomplished by numerous techniques, such as for example IR, thermal laser, hot air, high pressure steam, pressurized hot water spray, microwave, etc. With tine, new technologies will be available to impart the desired temperature to the copper-clad panel with the through-holes in it. Desirably, the heating should be focused or directed into the holes, in relation to the method chosen, reducing the heat sink effect of the copper cladding. Indeed, the elevated temperature is most needed at the hole-wall/solution interface, and not at the interface of the copper cladding/solution. A recently developed new technology by IBM, known as FLUID HEAD DRYER MANIFOLD, is a potential preferred heating mode of the through-holes in the laminate. The technique is described in U.S. Pat. No. 5,289,639, referenced herewith.

The optimal surface temperature of the panel can be varied, and computer-controlled to suit the bath in a given process step. It should take into consideration the fact that the heated panel will undergo some cooling before and during its immersion in a given process bath, and therefore the surface temperature of the panel is likely to be raised considerably above the recommended bath temperature of a given process step. The upper limit of the surface temperature will be dependent on the dielectric material, to avoid degradation.

When the invention is practiced in a vertical, automatic hoist apparatus, one can envision a single heating station, with the panel to be plated returning to the heating station as dictated by the temperature required for a given process step. The circuit board to be plated will preferably be sandwiched between two rigid sliding/movable insulating polymer sheets mounted on the jig, that will minimize cooling of the heated surface to be plated, as it travels to the designated process station. As the panel to be plated enters the solution, the two insulating polymer sheets either slide/retract upwards, or they can be immersed together with the panel to be plated.

Another possibility to practice the invention involves incorporation of the heating mechanism into the hoist with the heating being done while the hoist travels between process tanks and additionally, while the racks are moving upwards vertically when exiting a given process tank, and also while moving vertically downwards to enter the next process tank, as dictated by design. Such arrangement results in greater through-put, thanks to optimal use of hoist time.

When the invention is practiced in a horizontal mode, the station/heating element where the preheating is to take place is stationary and the panel to be plated can only move in a forward direction, as dictated by conveyorized, moving belt type equipment. Preheating therefore needs to be limited to the most critical process steps, i.e. prior to electroless plating, and perhaps activation.

A further embodiment of the invention contemplates pre-heating of the workpiece to be plated in an appropriate hot chemical solution, and entering the subsequent process tank without the usual water rinses, as accepted in the prior art. By enveloping the workpiece in a desirable, compatible hot liquid layer that will preferably participate in the interfacial chemical reaction, one can greatly enhance the desired effect of a given process. Electroless deposition, whether copper or nickel, is illustrative of one such potential advantage of this invention. While the mechanism of electroless deposition is still not properly understood, its initial stages are known to be critical and will essentially determine the success or failure of the desired electroless coating. Hence, entering, by way of example, the electroless tank directly following immersion in a hot alkaline aqueous accelerator, and without the recommended water rinse, can often be beneficially practiced. Alkaline accelerators are taught by patents referenced in the background section of the application and are standard practice with hypophosphite-reduced electroless coppers. Indeed, electroless deposition reaction consumes hydroxyl ions, and supplying them in the form of a heated layer at the workpiece/electroless bath interface, will greatly increase the flexibility and parameters of the initial deposition process, also known as "initiation".

There are numerous other industrial applications where the method of the present invention will be beneficial. Specifically, the method of introducing a substrate into a process tank with a chemical layer of a solution at the appropriate temperature, thereby promoting its participation in the desired reaction, enhances the final, desired reaction result. Thus, a preferred embodiment of this invention envisions applying to a workpiece a Participant Liquid Layer (PLL). PLL is defined in this invention as a heated liquid layer that coats the workpiece as it enters a given process tank such as electroless copper, nickel and enhances the desired reaction. The temperature of that liquid layer should be at least 5° C. above ambient, but in most cases will be significantly higher.

The practice of entering into a process tank with a preheated panel, with or without a heated PLL on the surface of said workpiece, offers many benefits, inter alia the following:

1. Maximization of initiation speed of chemical reactions at the PCB/solution interface, by eliminating or at least greatly reducing time delays due to heat transfer from the hot solution to the panel to be plated. Indeed, the invention allows the panel to enter the solution at the required temperature, which is especially beneficial for electroless deposition and also, though perhaps to a lesser degree, for adequate and speedy activation of the hole walls in the colloidal tin/palladium suspension.
2. Minimization of energy consumption, by affording solution operation at lower temperatures and making it unnecessary to keep the baths hot during idle machine time.
3. Improvement of bath stability, due to lower temperature of operation. This is especially true for formaldehyde-type electroless coppers. Indeed, because the solution can now be operated at temperatures of about 20° C., bath decomposition and consumption due to the well-known Canizzaro reaction can be significantly lower. This is of special importance in horizontal equipment where even moderate bath decomposition requires periodic stripping of copper metal deposited on the walls and bottom of the copper tank, necessitating a complete shutdown of the line.

4. Minimization of cycle time, resulting in improved through-put.
5. Lower concentrations and reduced operating temperature of Pd-based activators are possible, because of the higher temperature at the panel/solution interface. Indeed, the tin/Pd catalyst suspensions disclosed in U.S. Pat. Nos. 3,532,518 and 3,011,920 cannot sustain prolonged heating beyond 30–35° C., or else they will decompose. Also, it is known tat Pd prices are, as of late, cost-prohibitive. Lower Pd concentrations in working bath are contemplated by this invention, with considerable cost savings.

In addition to above improvements, additional benefits and possibilities will evolve with time, as this invention becomes available to equipment designers, PCB manufacturers, electroless platers in general, and others.

EXAMPLES

The benefits of the invention will be further illustrated by the examples given below.

Example 1

Two 3"×3" copper-clad glass epoxy FR-4 panels from which the copper has been etched away, were pre-treated (conditioned, activated, accelerated) and prepared for electroless copper deposition in a solution using hypophosphite as the sole reducer, in accordance with supplier's instructions. The supplier, MacDermid Inc. offers the electroless composition under the trade name of HM copper. Its chemistry is disclosed in U.S. Pat. No. 4,265,943 referenced in the prior art section of this application. The manufacturer's instructions call for an operating temperature of 70° C., and deposition time of about 20 min., prior to copper electroplating.

One of the panels was preheated for 5 min. in an air circulating oven set for 100° C., ahead of immersion in the HM copper solution at 55° C., for approximately 10 minutes. Within about one minute in the electroless solution, faint hydrogen evolution commenced at the vicinity of the immersed sample, indicating the onset of copper deposition. At the end of about 10 minutes in the HM solution, the panel was fully covered with Cu of satisfactory appearance, suitable for copper electroplating.

The second panel was not exposed to preheating, and entered the HM copper solution at 55° C., following acceleration and a water rinse. Inspecting the panel at the end of 20 minutes, it showed a barely noticeable, dark coating, deemed unsuitable for copper electroplating.

Example 2

Similar panels as in Example 1, were pre-treated and prepared for electroless plating in Macudep 22, a formaldehyde type electroless copper, offered by MacDermid Inc. Conditioning, activation and acceleration were performed in accordance with manufacturer's instructions. One panel was preheated in an air-circulating oven set at 100° C., as in Example 1, for about 5 min. It was then immersed in a solution of Macedup 22 at 18° C. Copious hydrogen evolution was noticed at the vicinity of the immersed panel almost immediately. At the end of 5 min. in the electroless copper bath, the panel was fully covered with a pink Cu coating, judged eminently suitable for Cu electroplating.

The other panel was immersed in the same electroless Cu solution after acceleration, and no pre heating. Electroless Cu initiation was slow and sluggish. Minimal hydrogen evolution was noticeable in the vicinity of the immersed sample. After 10 minutes in the electroless Cu bath the panel showed a dark deposit, deemed of questionable quality for electroplating of Cu.

While the invention has been described in terms of through-hole plated PCBs, it should be understood that it can generally be applied to both metallic and non-metallic substrates to be electrolessly plated. Also, electroless plating is not limited to Cu, and the invention includes electroless nickel and others. Furthermore, the invention is not limited to electroless chemical reactions, in general.

Having described the invention with regard to certain specific embodiments thereof, it is to be understood that the description is not meant as a limitation, since further modifications may now suggest themselves to those skilled in the art, and it is intended to cover such modifications as fall within the scope of the appended claims.

I claim:

1. A method for improving interfacial chemical reactions in electroless deposition of metals on the surface of a workpiece using an electroless plating solution in an electroless plating bath, said method comprising:

pre-treating the workpiece by at least one of conditioning, activation and acceleration; and pre-heating the workpiece in a pre-heating bath, for a period of up to approximately 5 minutes, prior to immersion thereof in the electroless plating solution, to a temperature approximately equal to or above the operating temperature of the electroless plating bath, such that the workpiece enters the electroless bath at a temperature approximately equal to the temperature reached during said pre-heating.

2. The method of claim 1, said method further comprising the step of heating the surface of the workpiece prior to immersion in a processing solution, said heating being such that the workpiece is heated to a temperature approximately equal to or above the temperature of the processing solution.

3. The method of claim 1 wherein part of the surface of a workpiece is non-metallic.

4. The method of claim 1 wherein the workpiece is flat.

5. The method of claim 1 wherein the workpiece is a copper-clad polymer.

6. The method of claim 5, wherein said copper-cad polymer comprises holes.

7. The method of claim 5 wherein said polymer is epoxy.

8. The method of claim 1 wherein the workpiece to be plated is preheated in a suitable chemical solution to a predetermined temperature, prior to immersion thereof in the electroless plating bath.

9. The method of claim 8 wherein said chemical solution is an alkaline aqueous accelerator.

10. The method of claim 8 wherein said predetermined temperature is at least 5° C. above ambient.

11. The method of claim 8, wherein said workpiece is immersed in the electroless plating bath without being exposed to a water rinse after said pre-heating in said suitable chemical solution.

12. The method of claim 1 wherein the workpiece is a printed circuit board (PCB).

* * * * *